United States Patent [19]
Kao et al.

[11] Patent Number: 5,492,847
[45] Date of Patent: Feb. 20, 1996

[54] COUNTER-IMPLANTATION METHOD OF MANUFACTURING A SEMICONDUCTOR DEVICE WITH SELF-ALIGNED ANTI-PUNCHTHROUGH POCKETS

[75] Inventors: Dah-Bin Kao, Palo Alto; Gregory S. Scott, Mountain View, both of Calif.

[73] Assignee: National Semiconductor Corporation, Santa Clara, Calif.

[21] Appl. No.: 283,458

[22] Filed: Aug. 1, 1994

[51] Int. Cl.[6] ................................................ H01L 21/266
[52] U.S. Cl. .............................. 437/44; 437/35; 437/953
[58] Field of Search ................................. 437/35, 28, 29, 437/45, 44, 149, 150, 953; 148/DIG. 18

[56] References Cited

U.S. PATENT DOCUMENTS

| | | | |
|---|---|---|---|
| 4,921,812 | 5/1990 | Nagai | 437/35 |
| 5,270,226 | 12/1993 | Hori et al. | 437/35 |

FOREIGN PATENT DOCUMENTS

| | | |
|---|---|---|
| 1-37055 | 2/1989 | Japan. |
| 2-1173 | 1/1990 | Japan. |

OTHER PUBLICATIONS

M. Aoki, et al.; 0.1 μm CMOS Devices Using Low–Impurity–Channel Transistors (LICT); IEDM 1990; pp. 9.8.1–9.8.3.
C. Duvvury, et al.; Reliability Design of $_p$+–Pocket Implant LDD Transistors; IEDM 1990; pp. 9.2.1–9.2.4.
S. S. Wong, D. R. Bradbury, D. C. Chen and K. Y. Chiu; Elevated Source/Drain Mosfet; IEDM 1984; pp. 634–637.
R. H. Yan, et al.; High Performance 0.1–μm Room Temperature Si MOSFETs; IEEE Symposium on VLSI Technology Digest of Technical Papers; pp. 86–87.
Takashi Hori, et al.; A 0.1–μm MOSFET with Shallow Tilt–Implanted Punchthrough Stopper (s–TIPS); IEDM 1989; pp. 1041–1042.
Atsushi Hori, et al; High Carrier Velocity and Reliability of Quarter–Micron SPI (Self-aligned Pocket Implantation) MOSFETs; IEDM 1992; pp. 699–702.
Takashi Hori and Kazumi Kurimoto; A New Half–Micron p–Channel Mosfet with Latips (Large–Tilt–Angle–Implanted–Punchthrough Stopper); IEDM 1988; pp. 394–397.
Takashi Hori; ¼–μm LATID (Large–Tilt–angle Implanted Drain) Technology For 3.3–V operation; IEDM 1989; pp. 777–780.

Primary Examiner—Chandra Chaudhari
Attorney, Agent, or Firm—Skjerven, Morrill, MacPherson, Franklin & Friel; Ken J. Koestner

[57] ABSTRACT

A method of processing a semiconductor device shapes a layer buried within a substrate of the semiconductor device. This layer has a conductivity the same as that of the substrate but has a higher doping level. In this process, a region of the layer is selected and ions of an opposite conductivity to the selected layer are counter-implanted in the region so that the doping level of the region is substantially canceled. A region of the layer adjacent to the counter-implanted region retains a higher doping level. Alternative techniques are employed to protect the doped region against the counter-implant. In a first approach, the layer is doped and subsequently a mask is formed on the surface of the substrate. The mask is furnished by a part of the semiconductor device, such as a spacer which is connected to the gate electrode after the dopant layer is formed in the substrate. After the mask is formed, ions are counter-implanted with the mask protecting the doped region. In a second approach, both the ion implant forming the doped layer and the counter-implant are performed after masking structures are formed, however the ion implant is a large-angle implant which implants ions beneath the masking structure while the counter-implant is a perpendicular implant so that regions beneath the masking structure are protected from cancellation.

25 Claims, 4 Drawing Sheets

5,492,847

COUNTER-IMPLANTATION METHOD OF MANUFACTURING A SEMICONDUCTOR DEVICE WITH SELF-ALIGNED ANTI-PUNCHTHROUGH POCKETS

BACKGROUND OF THE INVENTION

1. Field of the Invention

The present invention relates to a semiconductor device and a method of manufacturing a semiconductor device and, more particularly, to a fabrication method which furnishes anti-punchthrough protection.

2. Description of the Related Art

As CMOS integrated circuit technology has evolved, the size of CMOS transistor geometry is continually reduced. As CMOS gate lengths are reduced, the risk of a short-channel effect, called punch-through, rises. Punch-through is a circuit breakdown in which the drain voltage reaches a sufficiently large value that the depletion layer associated with the drain spreads across the substrate and reaches the source. This causes a destructive source/drain conduction path or leakage current.

Various approaches have been taken to avoid short-channel effects. One technique for avoiding punch-through is to raise the well or substrate dopant concentration, reducing the size of the depletion region so that punch-through does not occur when a voltage is applied. However, increasing the well concentration has drawbacks. The high substrate doping level causes a high source/drain junction capacitance, a low junction breakdown voltage, an increase in transistor threshold voltage and high body effects. Furthermore, a high well concentration reduces carrier mobility, leading to a lowering of drive current.

As an alternative to raising the dopant concentration generally throughout the well or substrate, anti-punchthrough (APT) implants have been developed. APT implants increase dopant concentrations only in the vicinity of the channel and source/drain region, not throughout the entire substrate. However, APT implants suffer similar drawbacks of high body effect, low carrier mobility and high junction capacitance. A specialized APT implant, called a HALO implant, is a self-aligned APT implant in which the polysilicon gate acts as a mask during implant. This mask prevents the channel region from reaching a concentration of dopant that is too heavy. HALO implants appear to lower body effect and prevent mobility degradation, nonetheless, source and drain junction capacitance remains elevated. Improvements to HALO implants have led to development of a large-angle HALO implant in which dopant ions are bombarded at a large angle, allowing the APT implant to reach regions overlaid by the polysilicon gate. For large-angle HALO implants, junction capacitance remains high if the large-angle implant is deeper than the source/drain junction but, if the large-angle implant is sufficiently shallow with respect to the source and drain, the junction capacitance does not increase. However, a shallow large-angle HALO implant may fail to block the punch-through path beneath the source and drain.

One promising APT approach is called a self-aligned pocket implant in which the APT implant is formed as a small pocket of a heavy dopant concentration. The APT pocket blocks the potential leakage path while allowing the channel region to maintain a lower dopant concentration. Thus, rather than raising the well concentration uniformly throughout the substrate, the self-aligned pocket implant raises dopant concentrations only where the increased doping is needed. One self-aligned pocket implant technique is described by Hori A. ("High Carrier Velocity and Reliability of Quarter-Micron SPI (Self-aligned Pocket Implantation) MOSFETS", IEDM 92-699, December 1992). Following the method of the Hori process, a localized pocket implant is formed using the gate electrode and a titanium silicide ($TiSi_2$) as self-aligned masks. There are some disadvantages to the Hori process. The masking properties of $TiSi_2$ are not well known so that the masking capability and the $TiSi_2$ layer thickness needed to appropriately mask a particular dopant are not established. Furthermore, the $TiSi_2$ layer thickness that is necessary for masking purposes may be incompatible with other requirements of the integrated circuit. In addition, the spacer must be removed while leaving the salicide ($TiSi_2$) and other dielectrics in the circuit undisturbed. Removing the spacer in this manner is a difficult procedure in a manufacturing environment.

SUMMARY OF THE INVENTION

The disclosed process advantageously furnishes an improved and manufacturable method for fabricating MOS transistors having self-aligned pockets of high impurity concentration. This method includes the steps of applying an APT implant and a lightly doped drain (LDD) implant, both steps using the transistor gate as a mask, and by canceling the APT implant in all regions other than the selected pocket regions using a counter-implant technique.

The illustrative process is advantageous because it furnishes an extra dopant concentration only where extra dopant impurities are beneficial, thereby reducing junction capacitance, lowering power consumption and improving transistor operating speed. The process furnishes a capability to precisely control position, size and dopant concentration of the APT pockets and the source/drain junctions.

These advantages are achieved in a process that includes no additional masking steps and only two implant steps in addition to the conventional MOS implant steps for a process that does not furnish APT protection.

The method of processing a semiconductor device, in accordance with one embodiment of the present invention, accomplishes shaping of a layer buried within a substrate of the semiconductor device. This layer has a conductivity the same as the substrate but has a higher dopant concentration level than the substrate. The method includes the steps of selecting a region of the layer and counter-implanting ions of a conductivity opposite the conductivity of the layer into the selected region of the layer so that the doping level of the layer in the selected region is lowered or substantially canceled and a region of the layer outside the selected region having the higher doping level remains buried within the substrate.

The step of selecting a region of the layer is accomplished by more than one approach. In one approach, a mask is formed on the surface of the substrate and the region of the layer outside the selected region is protected from counter-implantation by the mask. Advantageously, this mask is furnished by a component of the semiconductor device, such as a spacer which is connected to the gate electrode subsequent to the formation of the layer of high dopant concentration within the substrate but preceding the counter-implantation step.

In a second approach, both the ion implanting step of forming the layer of high dopant concentration and the step of counter-implanting the layer are performed after masking parts of the semiconductor device are formed. In this case, the implanting process of forming the layer of high dopant concentration is a large-angle implant process which implants ions beneath the masking structure and the counter-implanting process bombards ions in a direction perpendicular to the substrate surface so that regions beneath the masking structure are protected from counter-implantation of ions.

The various self-aligned mask and large angle implant approaches may be combined to form regions of high dopant concentration of different sizes and shapes.

A semiconductor device in accordance with a further embodiment of the invention includes a semiconductor substrate of a first conductivity type and a gate electrode having a top surface, a bottom surface and opposing lateral surfaces, which are coupled to spacers. Source and drain implant regions of a second conductivity type extend depthwise from the surface to a selected depth within the semiconductor substrate and extend laterally from approximately the lateral surface of the spacer. Two lightly doped implant regions of the second conductivity type and having a lower doping concentration than the source and drain implant regions are positioned in the substrate adjacent to the interior boundaries of the source and drain implant regions and each extend medially beneath the gate electrode. An anti-punchthrough implant region of the first conductivity type and having a higher doping concentration than the semiconductor substrate extends laterally substantially across the gate electrode and the spacers in a buried layer within the semiconductor substrate.

DETAILED DESCRIPTION OF THE INVENTION

Figure 1A:
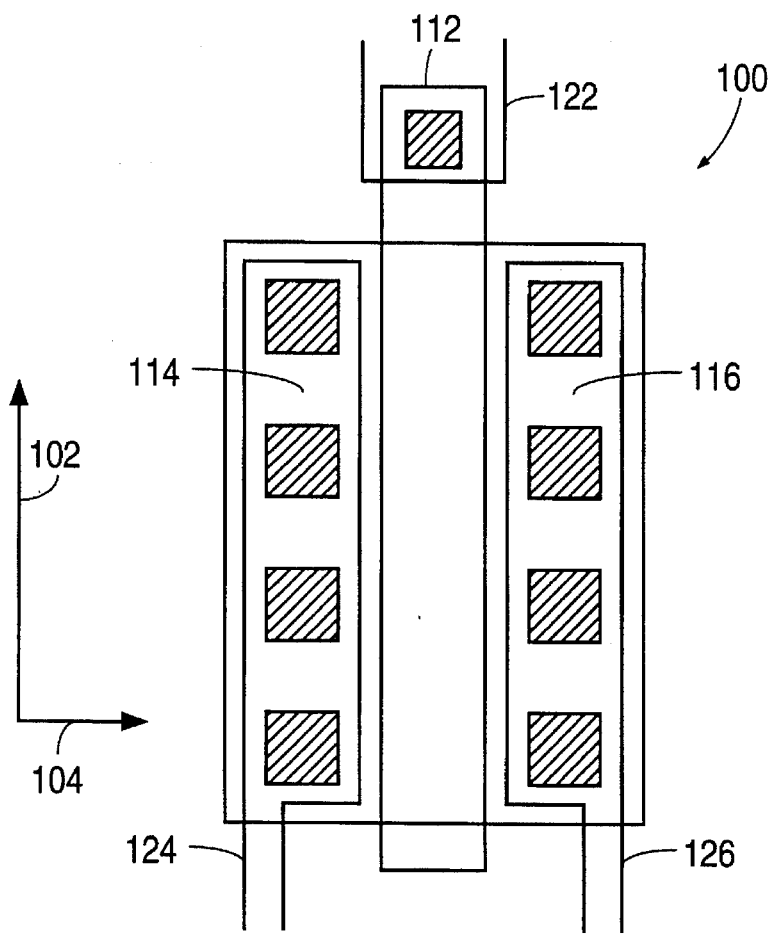
FIGS. 1a and 1b respectively illustrate a top plan view and sectional view of a prior art silicon-gate MOS transistor.
Figure 1B:
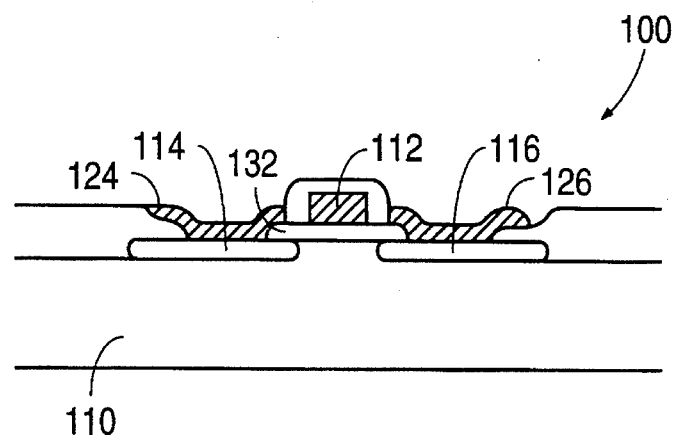

FIGS. 1a and 1b respectively show a top plan view and a corresponding process sectional view of a typical conventional silicon-gate MOS transistor 100 of the prior art and illustrate a form of the transistor 100 with respect to a longitudinal axis 102 and a widthwise dimension 104. Transistor 100 includes a substrate 110 (see cross section FIG. 1b), a polysilicon gate electrode 112, a source 114 and a drain 116 which are connected to other portions of an integrated circuit (not shown) using metal contacts including a gate contact 122, a source contact 124 and a drain contact 126. A layer of silicon dioxide 132 furnishes insulation. Electrically active parts of the transistor 100 occupy the region under the gate electrode 112.

Figure 2A:
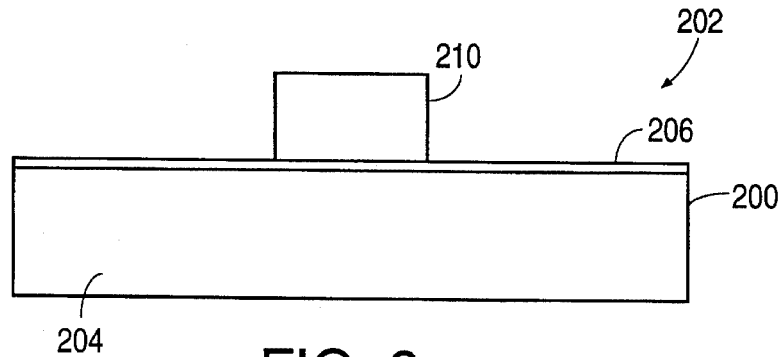
FIGS. 2(a)–2(g) are process sectional views showing a first embodiment in accordance with the invention of a method of manufacturing an n-channel MOS transistor on a semiconductor wafer.

An improved MOS transistor, generally having the form of MOS transistor 100, is fabricated in the manner of FIGS. 2(a) through 2(g), which are process sectional views showing a semiconductor wafer 200 at various sequential stages of fabrication of an n-channel MOS transistor 202 in accordance with the invention. In this manner, FIGS. 2(a) through 2(g) depict a first embodiment of a method of manufacturing the n-channel MOS transistor 202 on the semiconductor wafer 200. FIG. 2(a) shows a p-type semiconductor substrate or a p-well 204, upon the surface of which a layer of gate oxide 206 is formed. Gate oxide layer 206 is formed, using an oxidation process, to a thickness in a range from approximately 2 to 30 nm. A gate electrode 210 is formed on the surface of the gate oxide 206 overlying substrate 204 by depositing a polysilicon film and anisotropically etching the polysilicon film.

Figure 2B:
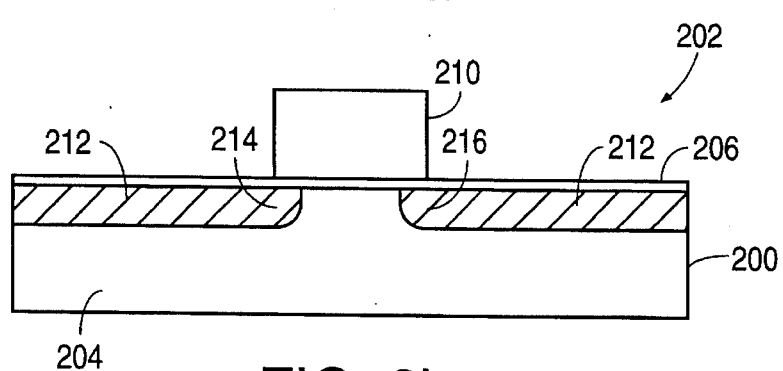

Referring to FIG. 2(b), an n-layer 212 is formed within substrate 204 at the substrate 204 surface using a lightly doped drain (LDD) implant technique, an ion implantation procedure which uses phosphorus as the dopant impurity to form the n-layer 212 having a relatively light dopant concentration. N-layer 212 is formed using gate electrode 210 as a mask so that n-layer 212 has two portions, one portion in a source region 214 and a second portion in a drain region 216. Note that, in a conventional single ion implant process, the region protected or shaded by the gate electrode is unavoidably masked. The phosphorus ion LDD implant process is applied so that the ions are directed toward the substrate 204 at multiple angles. Ions are implanted in a direction approximately perpendicular to the surface of substrate 204 to achieve deep penetration of ions into the substrate 204. The LDD implant process implants n-ions to a depth into the substrate 204 in a range from approximately $0.02\mu$ to about $0.50\mu$. Ions are also directed orthogonal to the longitudinal axis of MOS transistor 202 and inclined toward the gate 210 at any angle, but usually at an angle varying from 0° to 60° from perpendicular to the substrate 204 surface by rotating wafer 200 as ions are applied. Ions are directed toward gate 210 from both sides of gate 210 so that ions penetrate beneath gate 210 in a widthwise direction with respect to MOS transistor 202 for n-layer 212 in both source region 214 and drain region 216. Ions selected from phosphorus, arsenic, antimony ions and the like are implanted at an energy in a range conventional in the art to achieve a selected source and drain impurity ion amount.

Figure 2C:
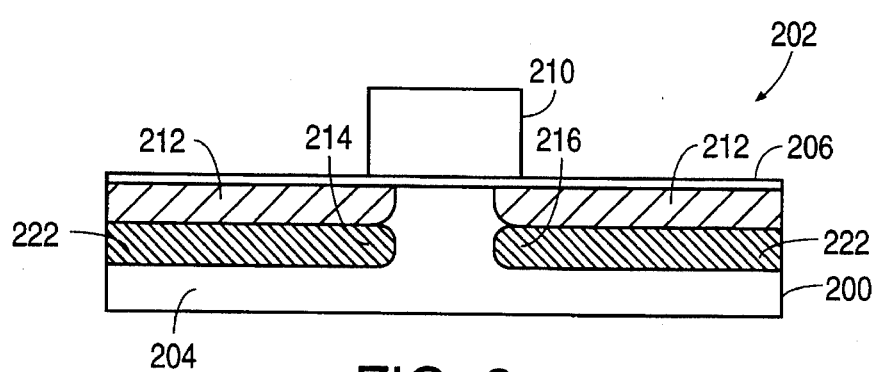

An anti-punchthrough (APT) implant, shown in FIG. 2(c), forms a p-layer APT implant 222 at the junction of n-layer 212 and substrate 204. P-layer APT implant 222, like n-layer 212, is formed using gate electrode 210 as a mask so that p-layer APT implant 222 also has two portions, one portion in the source region 212 and a second portion in the drain region 216. The APT implant is an ion implantation process which uses boron or $BF_2$ as the dopant impurity to form a p-layer having a thickness in a range from approximately $0.02\mu$ to about $0.50\mu$ and a dopant concentration in the range of about $10^{15}$ cm$^{-3}$ to approximately $10^{18}$ cm$^{-3}$. The illustrative APT implant may be achieved by a large-angle anti-punchthrough (LATAP) implant technique in which ions are directed toward the substrate 204 at multiple angles. Ions are implanted in a direction perpendicular to the surface of substrate 204 to furnish a selected depth of penetration of p-ions into the substrate 204. Wafer 200 is rotated at selected angles to direct ions orthogonal to the longitudinal axis of MOS transistor 202 and inclined toward the gate 210 at a tilt angle varying from approximately 0° to 60° from perpendicular to the substrate 204 surface. P-ions are directed toward gate 210 from both sides of gate 210 so that ions penetrate beneath gate 210 in a widthwise direction with respect to MOS transistor 202 for p-layer APT implant 222 at a junction between n-layer 212 and substrate 204. Boron ions are implanted at an energy in a conventional range in the art to attain a selected source APT and drain APT impurity ion amount.

Figure 2D:
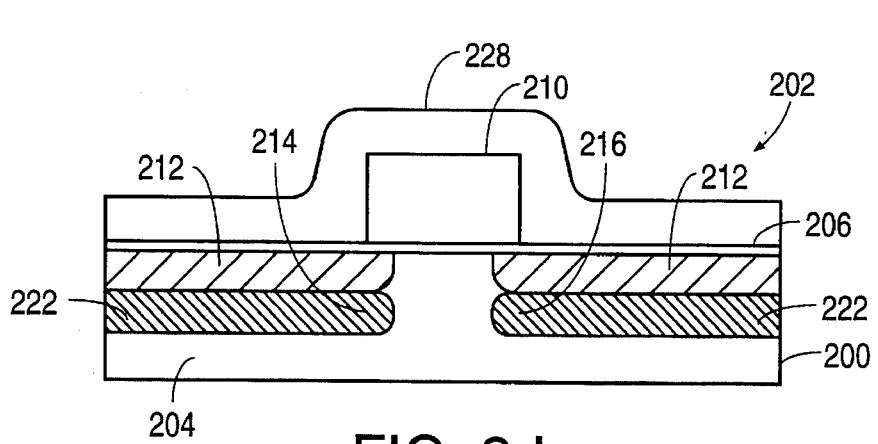
Figure 2E:
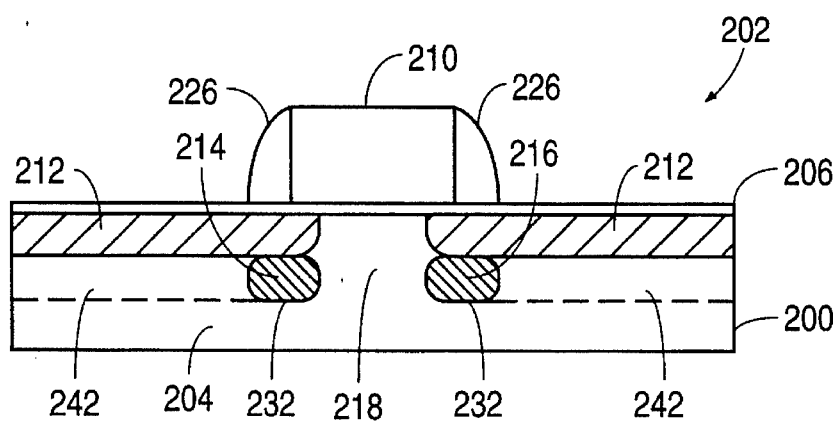

Spacers 226, shown in FIG. 2(e), are formed in the manner illustrated by FIG. 2(d) on lateral sides of gate 210 by depositing a dielectric film 228 such as a silicon dioxide ($SiO_2$) or silicon nitride ($Si_3N_4$) by chemical vapor deposition (CVD-$SiO_2$ or CVD-$Si_3N_4$) on the surface of wafer 200, and etching the dielectric film 228 by anisotropic etching. In this manner, the dielectric film 228 on the flat surfaces of wafer 200 is removed and sidewall spacers 226 produced from dielectric film 228 remain on the sides of gate 210.

After spacers 226 are formed, a counter-implant process is performed to cancel impurities of the p-layer APT implant 222 in all areas other than two respective p-ion pockets 232 beneath the edges of gate 210, shown in FIG. 2(e). Thus, the p-type APT (for example, boron) implants are countered by implanting n-type ions (e.g., phosphorus) in cancellation areas 242 of p-layer APT implant 222. Cancellation areas 242 have p-impurities that are canceled by the implant of n-impurities because the cancellation areas are not masked by gate 210 and spacers 226, unlike p-ion pockets 232. The n-type ion counter-implant process is applied so that the ions are directed toward the substrate 204 at substantially only one angle, the direction perpendicular to the surface of substrate 204. N-type ions are counter-implanted at an energy in a range which is usual for conventional implantation of ions to achieve a selected source and drain impurity ion amount. P-ion pockets 232 are formed in substrate 204 such that the deepest portion of the pockets 232 reaches a depth from the substrate 204 surface in a range from approximately 0.04 µm to 0.5 µm.

Figure 2F:
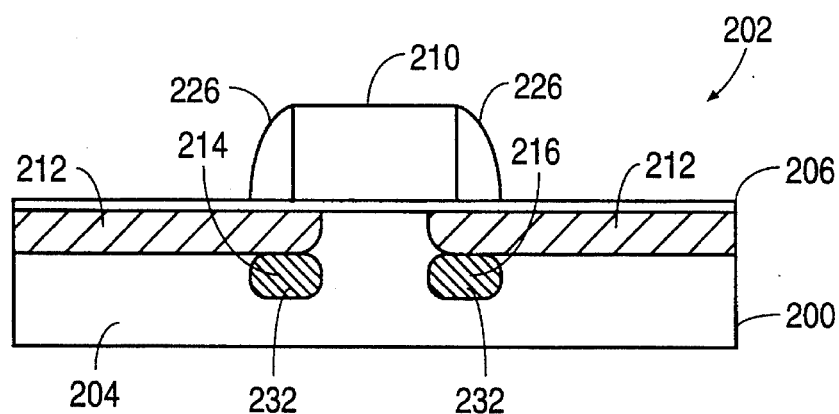

Thus, referring to FIG. 2(f), two APT pockets 232 are formed using only two implantation steps that are supplementary to the implantation steps for fabricating MOS transistors without an APT implant. The first supplementary APT implantation step is the APT implant. The second supplementary implantation step is the counter-implant, which cancels the APT implant except in the regions masked, or protected, by the gate 210 and spacer 226. The sizes, positions and ion concentrations of APT pockets 232 are determined by the size of gate 210 and spacers 226, the angle of application of the APT ion implant, the type of dopant, the implant process and the ion implant energy, all of which are easily controlled. Note that the counter-implant step for generating pockets 232 may be achieved without spacers 226 on the sides of gate 210 if the APT implant is a large-angle implant that positions APT endpoints beneath gate 210.

Figure 2G:
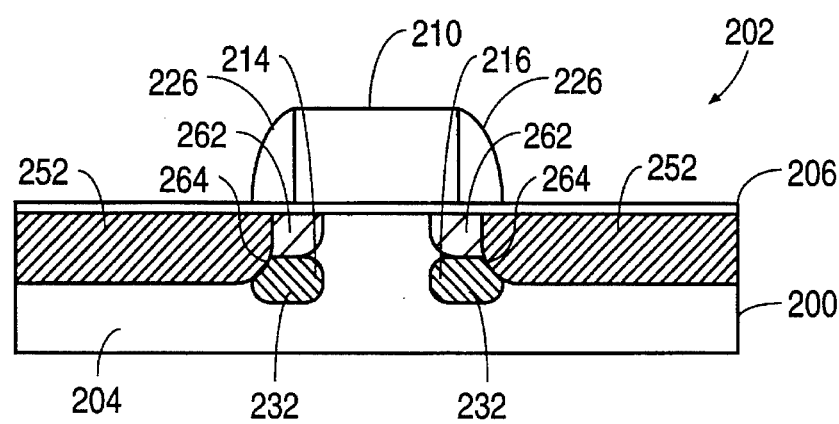

Referring to FIG. 2(g), a source/drain implant is performed by implanting arsenic ($As^+$) ions to form a source/drain layer 252 and to dope gate 210 to a higher degree. Source/drain implant 252, like n-layer 212 and p-layer APT implant 222, has a first portion in the source region 212 and a second portion in the drain region 216. Source/drain layer 252 is implanted on a portion of n-layer 212, leaving n-pockets 262 as the remnant of n-layer 212. N-pockets 262 are protected from the source/drain implant of $As^+$ ions by the mask afforded by gate 210 and spacers 226. Source/drain layer 252 is implanted deeper into substrate 204 than is n-layer 212. The deepest surface of the $n^+$ source/drain layer 252 has a depth in a range from approximately 0.02 µm to 0.5 µm with a typical depth of about 0.10 µm to 0.15 µm.

Following the source/drain implant, MOS transistor 202, as shown in FIG. 2(g), includes p-type substrate 204 and polysilicon gate 210 positioned on the surface of substrate 204. Silicon oxide spacers 226 are formed on lateral surfaces of gate 210. Within substrate 204, source/drain layer 252 extends along substrate 204 in the proximity of the substrate 204 surface. The two portions of source/drain 252 each terminate at a position beneath a spacer at the edge of gate 210. N-pockets 262 extend under gate 210 past the terminating boundaries 264 of source/drain layer 252. Each APT pocket 232 is positioned within substrate 204 adjacent to and beneath respective n-pockets 262 under one edge of gate 210, separated from the substrate 204 surface by n-layer 212. The sizes, positions and ion concentrations of APT pockets 232 are determined by the size of spacers 226, the angle of application of the APT ion implant, the type of dopant, the implant process and the ion implant energy, all of which are easily controlled.

Figure 3:
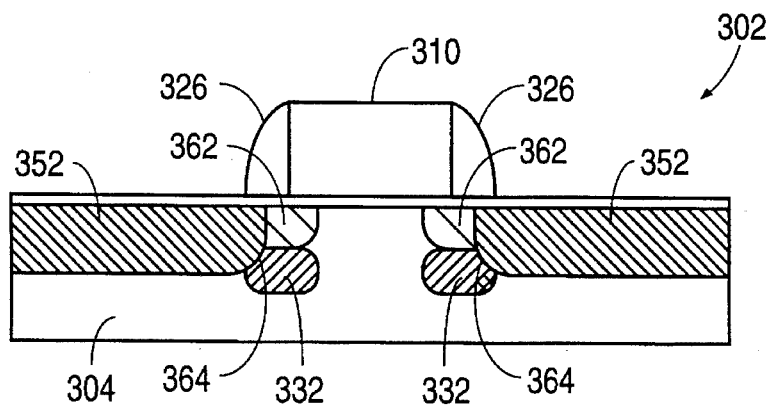
FIG. 3 is a process sectional view showing a p-channel MOS transistor resulting from a method depicted in FIGS. 2(a)–2(g) but modified for fabrication of p-channel MOS transistors.

The method illustrated in FIGS. 2(a) through 2(g) is applicable to fabrication of a p-channel MOS transistor 302, shown in FIG. 3, with a modification in which the polarities of implanted ions are reversed. P-channel MOS transistor 302 is manufactured using an n-type semiconductor substrate or n-well 304. A p-layer is implanted at the substrate 304 surface using a boron LDD implant. An n-layer APT implant is applied which uses phosphorus as the dopant impurity. A counter-implant process, using boron as a counter-implant ion, is performed to cancel impurities of the n-layer APT implant in all areas other than two respective n-ion pockets 332 beneath the edges of gate 310. A source/drain implant uses boron, $BF_2$ or a combination of boron and $BF_2$, rather than arsenic, to implant a source/drain layer 352.

P-channel MOS transistor 302, shown in FIG. 3, includes n-type substrate 304 and polysilicon gate 310 positioned on the surface of substrate 304. Silicon oxide spacers 326 are formed on lateral surfaces of gate 310. Within substrate 304, $p^+$-type source/drain layer 352 extends along n-type substrate 304 in the proximity of the substrate 304 surface. The two portions of source/drain 352 each terminate at a position beneath a spacer at the edge of gate 310. P-pockets 362 extend under gate 310 past the terminating boundaries 364 of source/drain layer 352. Each of two $n^+$-type APT pockets 332 is positioned within substrate 304 adjacent to and beneath respective p-pockets 362 under one edge of gate 310.

Figure 4A:
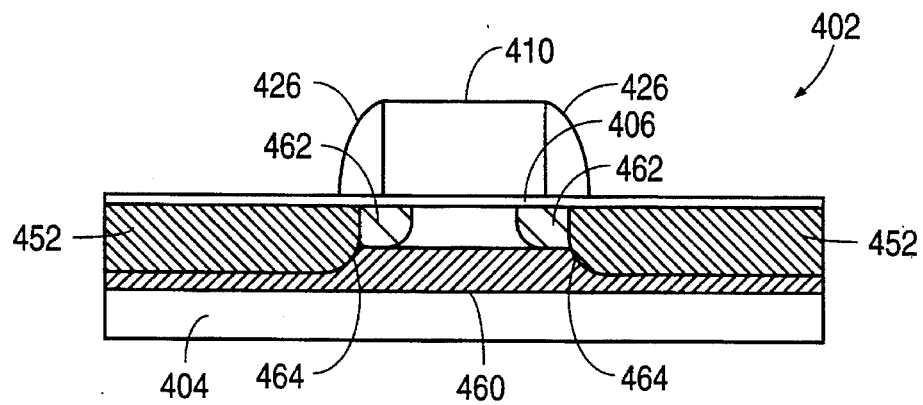
FIGS. 4(a)–4(b) are process sectional views showing an embodiment of a method of adapting a conventional APT manufacturing procedure to a manufacturing procedure for fabricating a p-channel MOS transistor having APT pockets.
Figure 4B:
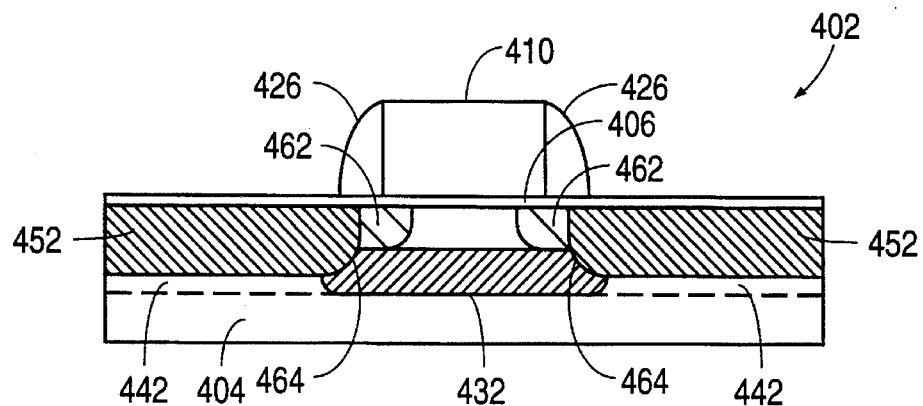

FIGS. 4(a)–4(b) are process sectional views showing a method of adapting a conventional APT manufacturing procedure to a manufacturing procedure for fabricating a p-channel MOS transistor having APT pockets. A p-channel MOS transistor 402 having an APT implant, as shown in FIG. 4(a), includes an n-type substrate or n-well 404 and polysilicon gate 410 positioned on the surface of substrate 404. Silicon oxide spacers 426 are formed on the lateral surfaces of gate 410 and a gate oxide layer 406 is formed at the surface of gate 410 adjacent to substrate 404. Within substrate 404, $p^+$-type source/drain layer 452 extends along substrate 404 in the proximity of the substrate 404 surface. The two portions of source/drain 452 each terminate at a position beneath a spacer at the edge of gate 410. An n-type APT implant 460 extends across transistor 402 at a junction between substrate 404 and $p^+$-type source/drain layer 452. P-pockets 462 extend under gate 410 past the terminating boundaries 464 of source/drain layer 452.

A counter-implant process is performed to cancel impurities of the n-layer APT implant 460 in all areas other than a single n-ion pocket 432 extending essentially across the substrate 404 channel beneath gate 210, shown in FIG. 4(b). Thus, an n-type phosphorus APT implant is countered by implanting p-type boron in cancellation areas 442 of n-layer APT implant 460. Cancellation areas 442 have n-impurities that are canceled by the implant of boron p-impurities since cancellation areas are not masked by gate 410 and spacers 426 as is n-ion pocket 432. The boron ion counter-implant process is applied so that the ions are directed toward the substrate 404 in the direction perpendicular to the surface of substrate 404 or at a tilt angle. The single APT pocket 432 is positioned within substrate 404 adjacent to and beneath respective p-pockets 462 under one edge of gate 410, separated from the substrate 404 surface by p-pockets 462.

The process depicted in FIGS. 4(a)–4(b) may be modified to furnish a method for fabricating an n-channel MOS transistor having APT pockets. In this modified process, a p-type substrate or p-well is doped with ions that are complementary to the type of dopant ions shown in FIGS. 4(a) and 4(b).

Anti-punchthrough techniques generally avoid short channel effects at the expense of increasing source/drain junction capacitance. The improvement achieved by the counter-implantation process is expressed as a reduction in source/drain junction capacitance while effectively preventing punchthrough. Generally the junction capacitance is advantageously reduced by decreasing the size and charge concentration of the APT implant. However, the effectiveness of the APT implant in reducing short channel effects and preventing punchthrough depends primarily on the position of the APT implant in the path of the source/drain junction, rather than the size of the APT implant, although the size and ion impurity concentration of the implant should be sufficient to avoid punchthrough. The described embodiment of a fabrication process furnishes a method for precisely controlling the positions, sizes and impurity concentrations of dopant pockets. In turn, the described fabrication process supplies a method for controlling short channel effects, junction capacity, body effects and carrier mobility.

The illustrative counter-implant method furnishes a procedure for improving junction capacitance of a transistor in comparison to conventional APT approaches. However, the illustrative counter-implant method also furnishes a process that improves the junction capacitance over transistors that do not incorporate an APT technique. Junction capacitance is reduced below that of a transistor which does not utilize an APT implant by making the well doping lighter in the source and drain regions 242 than in the channel region 218, shown in FIG. 2(e). This is achieved by choosing the counter-implant dosage and energy so that the counter-implant overcompensates for the APT implant, effectively producing deeper and less abrupt source and drain junctions. Source and drain junctions of this form promote connections of the source and drain with external contacts and advantageously facilitate silicide formation. At the same time, the transistor may be optimized by forming shallow source and drain junctions, which are confined by anti-punchthrough pockets. Thus, the illustrative method not only effectively avoids deleterious short channel effects and punchthrough but also allows improvement of transistor operating characteristics regardless of APT performance.

Various other embodiments and modifications and improvements not described herein may be within the spirit and scope of the present invention, as defined by the following claims.

For example, the illustrative process applies to n-channel and p-channel transistors (N-MOSFETs and P-MOSFETs) and to surface channel as well as buried channel transistors. The counter-implant does not have to match the APT implant in ionic balance or in depth or position within the substrate or well field.

Furthermore, although the described counter-implant process is described as a method for furnishing an improved APT implant, the method has a more general applicability for precisely tailoring dopant regions to improve transistor performance without regard for APT performance. In this manner, "drain engineering" is possible in which the size and depth of the transistor channel and source/drain form are finely tuned to control junction capacitance, leakage current and charge mobility, as well as to furnish adequate depth of the external source/drain junctions for electrical contacts and silicidation.

We claim:

1. A method of shaping a layer buried within a substrate of a semiconductor device, the layer having a conductivity the same as the substrate and having a higher doping level than the substrate, the method comprising the steps of:

selecting a region of the layer; and counter-implanting ions of a conductivity opposite the conductivity of the layer into the selected region of the layer so that the layer doping level in the selected region is substantially canceled and a region of the layer outside the selected region having the higher doping level remains buried in the substrate.

2. A method as in claim 1 wherein the counter-implanting step further comprises the step of:

forming a mask structure on a surface of the substrate;

wherein the region of the layer outside the selected region is protected from counter-implantation by the mask structure.

3. A method as in claim 2 wherein:

a gate electrode is coupled to the surface of the substrate;

a spacer is formed on a surface of the gate electrode; and the spacer and gate furnish the mask structure.

4. A method as in claim 1 wherein:

a gate electrode is coupled to the surface of the substrate;

the layer is formed by a large-angle implantation process inclining at an angle from a direction which is perpendicular to the substrate surface, the buried layer extending partially beneath the gate electrode; and the counter-implanting step implants ions from a direction substantially perpendicular to the substrate surface so that a portion of the layer region extending beneath the gate electrode substantially remains at the higher doping level region of the layer.

5. A method as in claim 1 wherein the semiconductor device is an n-channel device, the substrate and the layer have a p-type conductivity and the counter-implant is an n-type ion implant.

6. A method as in claim 5 wherein the n-type counter implant is a phosphorus ion implant.

7. A method as in claim 1 wherein the semiconductor device is a p-channel device, the substrate and the layer have an n-type conductivity and the counter-implant is a p-type ion implant.

8. A method as in claim 7 wherein the p-type counter implant is a boron ion implant.

9. A method of forming an anti-punchthrough implant in a semiconductor device comprising the steps of:

forming an anti-punchthrough implant region within a substrate, the anti-punchthrough implant having a conductivity the same as the substrate and having a higher doping level than the substrate; and counter-implanting ions of a conductivity opposite the conductivity of the anti-punchthrough implant into regions of the anti-punchthrough implant region so that the anti-punchthrough doping level in the regions is substantially canceled and an anti-punchthrough implant pocket remains buried in the substrate.

10. A method as in claim 9 wherein the counter-implanting step further comprises the step of:

forming a mask structure on a surface of the substrate;

wherein the anti-punchthrough pocket is protected from counter-implantation by the mask structure.

11. A method as in claim 10 further comprising the steps of:

coupling a gate electrode to the surface of the substrate; and forming a spacer on a lateral surface of the gate electrode subsequent to the anti-punchthrough implant step but preceding the counter-implanting step;

wherein the spacer and gate furnish the mask structure for the anti-punchthrough pocket.

12. A method as in claim 9 further comprising the steps of:

coupling a gate electrode to the surface of the substrate; and large-angle implanting the anti-punchthrough implant at an angle from a direction which is perpendicular to the substrate surface, the buried anti-punchthrough region extending partially beneath the gate electrode;

wherein the counter implanting step implants ions from a direction substantially perpendicular to the substrate surface so that a portion of the anti-punchthrough region extending beneath the gate electrode substantially remains as the anti-punchthrough pocket.

13. A method as in claim 9 wherein the semiconductor device is an n-channel device, the substrate has a p-type conductivity, the anti-punchthrough implant is a p-type ion implant and the counter-implant is an n-type ion implant.

14. A method as in claim 13 wherein the anti-punchthrough implant is a boron ion implant and the counter-implant is a phosphorus ion implant.

15. A method as in claim 9 wherein the semiconductor device is a p-channel device, the substrate has an n-type conductivity, the anti-punchthrough implant is an n-type ion implant and the counter-implant is a p-type ion implant.

16. A method as in claim 15 wherein the anti-punchthrough implant is a phosphorus ion implant and the counter-implant is a boron ion implant.

17. A method of fabricating a semiconductor device, comprising the steps of:

forming two lightly doped implant regions of a first conductivity type each on a side of a gate electrode in a semiconductor substrate of a second conductivity type using the gate electrode as a mask structure, the gate electrode being coupled to the semiconductor substrate surface;

forming two anti-punchthrough implant regions, having the second conductivity type and a higher doping level than the semiconductor substrate doping level, each buried in the semiconductor substrate under the lightly doped implant regions on a side of the gate electrode using the gate electrode as a mask structure;

counter-implanting ions of the first conductivity type into regions of the two anti-punchthrough implant regions so that the anti-punchthrough doping level in the regions is substantially canceled and two anti-punchthrough implant pockets remain buried in the semiconductor substrate substantially beneath the edges of the gate electrode; and forming source and drain implant regions of the first conductivity type in the semiconductor substrate using the gate electrode as a mask structure.

18. A method as in claim 17 wherein the counter-implanting step further comprises the step of:

forming spacers on lateral surfaces of the gate electrode;

wherein the anti-punchthrough pockets are masked by the gate electrode and the spacers.

19. A method as in claim 17 wherein:

the step of forming the anti-punchthrough implant region includes the step of large-angle implanting the anti-punchthrough implant at an angle from a direction which is perpendicular to the semiconductor substrate surface, each of the buried anti-punchthrough regions extending partially beneath the gate electrode;

wherein the counter-implanting step implants ions from a direction substantially perpendicular to the semiconductor substrate surface so that portions of the anti-punchthrough regions extending beneath the gate electrode substantially remain as the anti-punchthrough pockets.

20. A method as in claim 17, wherein the lightly doped implant regions are implanted substantially in a region along the surface of the semiconductor substrate and the anti-punchthrough implant regions are implanted deeper in the semiconductor substrate, substantially adjacent to the lightly doped implant regions.

21. A method as in claim 17 wherein the gate electrode is coupled to the semiconductor substrate surface by an insulating layer.

22. A method as in claim 17 wherein the semiconductor device is an n-channel device, the semiconductor substrate has a p-type conductivity, the lightly doped implant is an n-type ion implant, the anti-punchthrough implant is a p-type ion implant, the counter-implant is an n-type ion implant and the source/drain implant is an n-type ion implant.

23. A method as in claim 22 wherein the lightly doped implant is a phosphorus ion implant, the anti-punchthrough implant is a boron ion implant, the counter-implant is a phosphorus ion implant and the source/drain implant is an arsenic ion implant.

24. A method as in claim 17 wherein the semiconductor device is a p-channel device, the semiconductor substrate has a n-type conductivity, the lightly doped implant is a p-type ion implant, the anti-punchthrough implant is an n-type ion implant, the counter-implant is a p-type ion implant and the source/drain implant is a p-type ion implant.

25. A method as in claim 24 wherein the lightly doped implant is a boron or $BF_2$ ion implant, the anti-punchthrough implant is a phosphorus ion implant, the counter-implant is a boron ion implant and the source/drain implant is a p-type ion implant selected from a boron ion implant, a $BF_2$ ion implant and a combination boron and $BF_2$ ion implant.

* * * * *